US011041895B1

United States Patent
Hwang et al.

(10) Patent No.: US 11,041,895 B1
(45) Date of Patent: Jun. 22, 2021

(54) PROBE ANTENNA, PROBING SYSTEM, AND POWER DENSITY MEASURING METHOD FOR MEASURING POWER DENSITY IN NEAR-FIELD ELECTROMAGNETIC FIELD

(71) Applicant: Electronics and Telecommunications Research Institute, Daejeon (KR)

(72) Inventors: Jung Hwan Hwang, Daejeon (KR); Duk Soo Kwon, Daejeon (KR); Chang Hee Hyoung, Daejeon (KR); Jong Hwa Kwon, Daejeon (KR); Hyung Do Choi, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 16/851,411

(22) Filed: Apr. 17, 2020

(30) Foreign Application Priority Data

Dec. 12, 2019 (KR) .......................... 10-2019-0165412

(51) Int. Cl.
*G01R 29/08* (2006.01)
*G01R 29/10* (2006.01)

(52) U.S. Cl.
CPC ..... *G01R 29/0871* (2013.01); *G01R 29/0878* (2013.01); *G01R 29/0892* (2013.01); *G01R 29/10* (2013.01)

(58) Field of Classification Search
CPC . G01R 29/10; G01R 29/0878; G01R 29/0892
See application file for complete search history.

(56) References Cited

U.S. PATENT DOCUMENTS

| 5,231,346 A | 7/1993 | Gassmann | |
|---|---|---|---|
| 8,305,282 B2 | 11/2012 | Galluppi | |
| 8,610,630 B2 | 12/2013 | Yun | |
| 8,669,904 B2 | 3/2014 | Choi et al. | |
| 10,254,324 B2 | 4/2019 | Hoang et al. | |
| 2009/0160719 A1* | 6/2009 | Kato | H01Q 1/2225 343/742 |
| 2012/0306521 A1* | 12/2012 | Nickel | H01L 21/00 324/754.03 |
| 2016/0050032 A1* | 2/2016 | Emerson | H01Q 1/38 455/115.2 |
| 2017/0005412 A1* | 1/2017 | DeLisio, Jr. | H03F 3/602 |

FOREIGN PATENT DOCUMENTS

WO        2012012378 A1    1/2012

\* cited by examiner

*Primary Examiner* — Alvaro E Fortich
(74) *Attorney, Agent, or Firm* — William Park & Associates Ltd.

(57) ABSTRACT

A probe antenna, a probing system, and a power density measuring method to measure a power density of a near-field electromagnetic field are disposed. The probe antenna includes a board, and a conductor transmitting line formed on the board, having a constant line width, and formed in a polygonal shape or in a closed-curve shape. The conductor transmitting line is divided into a first transmitting line and a second transmitting line that are separated from each other, and includes a first receiving port formed with one end of the first transmitting line and one end of the second transmitting line and a second receiving port formed with another end of the first transmitting line and another end of the second transmitting line.

14 Claims, 7 Drawing Sheets

PROBE ANTENNA, PROBING SYSTEM, AND POWER DENSITY MEASURING METHOD FOR MEASURING POWER DENSITY IN NEAR-FIELD ELECTROMAGNETIC FIELD

CROSS-REFERENCE TO RELATED APPLICATION(S)

This application claims the priority benefit of Korean Patent Application No. 10-2019-0165412 filed on Dec. 12, 2019, in the Korean Intellectual Property Office, the disclosure of which is incorporated herein by reference for all purposes.

BACKGROUND

1. Field

One or more example embodiments relate to a probing system and method for measuring a power density using a probe antenna, and more particularly, to a device and method for measuring a power density of a near-field electromagnetic field by processing a signal output from a probe antenna when the probe antenna is exposed to the near-field electromagnetic field.

2. Description of Related Art

In a wireless communication antenna system, an electromagnetic field generated by an antenna may change from a near-field electromagnetic field to a far-field electromagnetic field as a distance from the antenna increases.

An existing probing system may measure one of a strength of an electric field and a strength of a magnetic field using a probe antenna and calculate a power density of a far-field electromagnetic field using a result of the measuring to evaluate the performance of a wireless communication antenna.

However, in a case in which a distance from the antenna to a measurement point is not sufficient, it may need to measure an electromagnetic field in a near-field region. However, the electromagnetic field in the near-field region may have a different characteristic from that of an electromagnetic field in a far-field region. In detail, when a medium is uniform, in a far-field region, a wave impedance defined by a ratio between a strength of an electric field and a strength of a magnetic field may not vary based on a position but permanently constant. In contrast, in a near-field region, a wave impedance may have different values based on a position. In addition, the electric field and the magnetic field in the far-field region may have phases that are not different each other, whereas those in the near-field region may have phases that are different. Thus, there may be a phase difference between the electric field and the magnetic field in the near-field region.

Thus, the existing probing system that calculates a power density by measuring one of a strength of an electric field and a strength of a magnetic field may not measure a power density of a near-field electromagnetic field.

Thus, there is a desire for a probing system that may measure a power density of a near-field electromagnetic field.

SUMMARY

An aspect provides a device and method for measuring a power density of an electromagnetic field even in a near-field region having a phase difference between a magnetic field and an electric field by calculating a power density based on the phase difference between the magnetic field and the electric field.

According to an example embodiment, there is provided a probe antenna including a board, and a conductor transmitting line formed on the board, having a constant line width, and formed in a polygonal shape or in a closed-curve shape. The conductor transmitting line may be divided into a first transmitting line and a second transmitting line that are separated from each other, and include a first receiving port formed with one end of the first transmitting line and one end of the second transmitting line, and a second receiving port formed with another end of the first transmitting line and another end of the second transmitting line.

An input impedance of the first receiving port and the second receiving port may be determined based on a length of the first transmitting line and the second transmitting line.

As the conductor transmitting line operates as a loop antenna by a magnetic field input to the probe antenna, the conductor transmitting line may generate a potential difference at the first receiving port and the second receiving port, respectively, each of which is proportional to a strength of the magnetic field.

The first receiving port may generate a potential difference that has a same magnitude as that of a potential difference output from the second receiving port and a direction opposite to that of the potential difference output from the second receiving port.

As transmitting line areas including the first receiving port and the second receiving port operate as different dipole antennas by an electric field input to the probe antenna, the conductor transmitting line may generate a potential difference at the first receiving port and the second receiving port, respectively, each of which is proportional to a strength of the electric field.

The first receiving port may generate a potential difference that has a same magnitude and a same direction as that of a potential difference output from the second receiving port.

The first receiving port may output a first output signal by adding a potential difference that is proportional to a strength of a magnetic field and a potential difference that is proportional to a strength of an electric field. The second receiving port may output a second output signal by adding a potential difference obtained by reversing a sign of a potential difference that is proportional to a strength of a magnetic field and a potential difference that is proportional to a strength of an electric field.

The first receiving port may output a first output signal by adding a potential difference obtained by reversing a sign of a potential difference that is proportional to a strength of a magnetic field and a potential difference that is proportional to a strength of an electric field. The second receiving port may output a second output signal by adding a potential difference that is proportional to a strength of a magnetic field and a potential difference that is proportional to a strength of an electric field.

According to another example embodiment, there is provided probing system including a probe antenna including a board, and a conductor transmitting line formed on the board, having a constant line width, and formed in a polygonal shape or a closed-curve shape, and a power density measurer configured to measure a power density of an electromagnetic field using output signals of the probe antenna. The conductor transmitting line may be divided into a first transmitting line and a second transmitting line that are separated from each other, and include a first receiving port formed with one end of the first transmitting line and one end of the second transmitting line, and a second receiving port formed with another end of the first transmitting line and another end of the second transmitting line. The power density measurer may include a power density operator configured to measure the power density of the electromagnetic field using a first output signal output from the first receiving port and a second output signal output from the second receiving port.

As the conductor transmitting line operates as a loop antenna by a magnetic field input to the probe antenna, the conductor transmitting line may generate a potential difference at the first receiving port and the second receiving port that is proportional to a strength of the magnetic field. As transmitting line areas including the first receiving port and the second receiving port operate as different dipole antennas by an electric field input to the probe antenna, the conductor transmitting line may generate a potential difference at the first receiving port and the second receiving port that is proportional to a strength of the electric field.

The first receiving port may output the first output signal by adding a potential difference that is proportional to a strength of a magnetic field and a potential difference that is proportional to a strength of an electric field. The second receiving port may output the second output signal by adding a potential difference obtained by reversing a sign of a potential difference that is proportional to a strength of a magnetic field and a potential difference that is proportional to a strength of an electric field.

The first receiving port may output the first output signal by adding a potential difference obtained by reversing a sign of a potential difference that is proportional to a strength of a magnetic field and a potential difference that is proportional to a strength of an electric field. The second receiving port may output the second output signal by adding a potential difference that is proportional to a strength of a magnetic field and a potential difference that is proportional to a strength of an electric field.

The power density measurer may further include a radio frequency (RF) remover configured to extract direct current (DC) signals by removing an RF signal from each of the first output signal of the first receiving port and the second output signal of the second receiving port. The power density operator may measure the power density of the electromagnetic field based on a result of subtracting the DC signal extracted from the first output signal and the DC signal extracted from the second output signal from each other. According to still another example embodiment, there is provided a power density measuring method including receiving, from a probe antenna, output signals based on a potential difference proportional to a strength of a magnetic field and a potential difference proportional to a strength of an electric field, and measuring a power density of an electromagnetic field using the output signals. The probe antenna may include a conductor transmitting line that is divided into a first transmitting line and a second transmitting line that are separated from each other, and includes a first receiving port formed with one end of the first transmitting line and one end of the second transmitting line, and a second receiving port formed with another end of the first transmitting line and another end of the second transmitting line. As the conductor transmitting line operates as a loop antenna by a magnetic field input to the probe antenna, the conductor transmitting line may generate a potential difference at the first receiving port and the second receiving port that is proportional to a strength of the magnetic field. As transmitting line areas including the first receiving port and the second receiving port operate as different dipole antennas by an electric field input to the probe antenna, the conductor transmitting line may generate a potential difference at the first receiving port and the second receiving port that is proportional to a strength of the electric field.

The first receiving port may output a first output signal by adding a potential difference that is proportional to a strength of a magnetic field and a potential difference that is proportional to a strength of an electric field. The second receiving port may output the second output signal by adding a potential difference obtained by reversing a sign of a potential difference that is proportional to a strength of a magnetic field, and a potential difference that is proportional to a strength of an electric field.

The first receiving port may output the first output signal by adding a potential difference obtained by reversing a sign of a potential difference that is proportional to a strength of a magnetic field and a potential difference that is proportional to a strength of an electric field. The second receiving port may output the second output signal by adding a potential difference that is proportional to a strength of a magnetic field and a potential difference that is proportional to a strength of an electric field.

The power density measuring method may further include extracting DC signals by removing an RF signal from each of the first output signal of the first receiving port and the second output signal of the second receiving port. The measuring of the power density may include measuring the power density of the electromagnetic field based on a result of subtracting the DC signal extracted from the first output signal and the DC signal extracted from the second output signal from each other.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the present disclosure will become apparent and more readily appreciated from the following description of example embodiments, taken in conjunction with the accompanying drawings of which.

DETAILED DESCRIPTION

Figure 1:
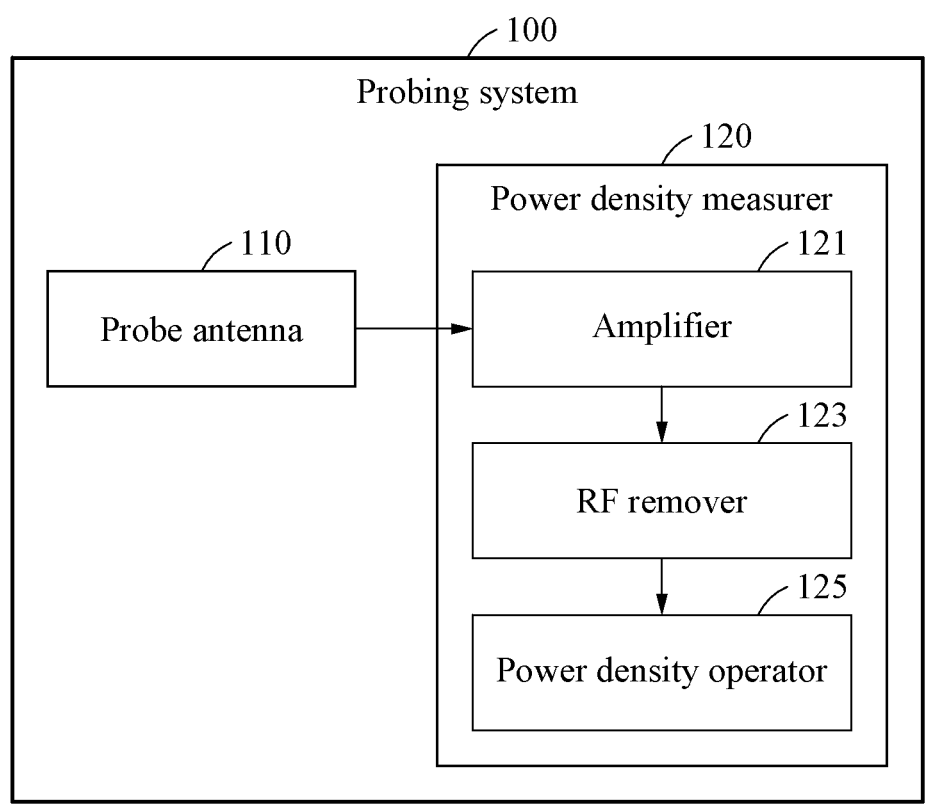
FIG. 1 is a diagram illustrating an example of a probing system according to an example embodiment.

Hereinafter, some examples will be described in detail with reference to the accompanying drawings. However, various alterations and modifications may be made to the examples. Here, the examples are not construed as limited to the disclosure and should be understood to include all changes, equivalents, and replacements within the idea and the technical scope of the disclosure.

The terminology used herein is for the purpose of describing particular examples only and is not to be limiting of the examples. As used herein, the singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

When describing the examples with reference to the accompanying drawings, like reference numerals refer to like constituent elements and a repeated description related thereto will be omitted. In the description of examples, detailed description of well-known related structures or functions will be omitted when it is deemed that such description will cause ambiguous interpretation of the present disclosure.

Hereinafter, example embodiments will be described in detail with reference to the accompanying drawings.

FIG. 1 is a diagram illustrating an example of a probing system according to an example embodiment.

Referring to FIG. 1, a probing system 100 includes a probe antenna 110 and a power density measurer 120.

The probe antenna 110 includes a board, and a conductor transmitting line formed on the board, having a constant line width, and formed in a polygonal shape or a closed-curve shape. The conductor transmitting line is divided into two portions—a first transmitting line and a second transmitting line that are separated from each other. The conductor transmitting line includes a first receiving port formed with one end of the first transmitting line and one end of the second transmitting line, and a second receiving port formed with another end of the first transmitting line and another end of the second transmitting line.

The conductor transmitting line may operate as a loop antenna by a magnetic field input to the probe antenna 110. The conductor transmitting line may generate a potential difference at the first receiving port and the second receiving port that is proportional to a strength of the magnetic field input to the probe antenna 110. For example, the first receiving port may generate a potential difference that has the same magnitude as that of a potential difference output from the second receiving port and a direction opposite to that of the potential difference output from the second receiving port.

In addition, areas of the conductor transmitting line including the first receiving port and the second receiving port may operate as different dipole antennas by an electric field input to the probe antenna 110. The areas including the first receiving port and the second receiving port may generate a potential difference at the first receiving port and the second receiving port that is proportional to a strength of the electric field input to the probe antenna 110. For example, the first receiving port may generate a potential difference that has the same magnitude and direction as those of a potential difference output from the second receiving port.

For example, the first receiving port may output a first output signal by adding the potential difference that is proportional to the strength of the magnetic field and the potential difference that is proportional to the strength of the electric field. The second receiving port may output a second output signal by adding a potential difference obtained by reversing a sign of the potential difference that is proportional to the strength of the magnetic field, and the potential difference that is proportional to the strength of the electric field. In addition, the first receiving port may output the first output signal by adding a potential difference obtained by reversing a sign of the potential difference that is proportional to the strength of the magnetic field and the potential difference that is proportional to the strength of the electric field. The second receiving port may output the second output signal by adding the potential difference that is proportional to the strength of the magnetic field and the potential difference that is proportional to the strength of the electric field.

The power density measurer 120 may measure a power density of an electromagnetic field in a near-field region, using the first output signal and the second output signal. The power density measurer 120 includes an amplifier 121, a radio frequency (RF) remover 123, and a power density operator 125 as illustrated in FIG. 1.

The amplifier 121 may amplify the first output signal and the second output signal and transmit the amplified signals to the RF remover 123.

The RF remover 123 may extract direct current (DC) signals by removing RF signals respectively from the amplified first output signal and the amplified second output signal. The RF remover 123 may be an RF choke, for example.

The power density operator 125 may be disposed or installed at a position separate from the probe antenna 110 such that the power density operator 125 is electrically isolated from the probe antenna 110. The power density operator 125 may subtract the DC signal extracted from the first output signal and the DC signal extracted from the second output signal from each other to measure a power density of a near-field electromagnetic. The power density operator 125 may be one of a processor, a device including the processor, and a personal computer (PC), for example.

The probing system 100 may measure an electric field and a magnetic field using a single probe antenna and also measure a phase difference between the electric field and the magnetic field, and may thus measure a power density of a near-field electromagnetic field without an error.

In addition, the power density operator 125 configured to measure a power density of a near-field electromagnetic field may be disposed to be electrically isolated from the probe antenna 110, and thus the probing system 100 may minimize an influence of the power density operator 125 on the near-field electromagnetic field. With the power density operator 125 being disposed separately from the probe antenna 110, the probing system 100 may extract a DC signal from an output of the probe antenna 110 using the RF remover 123, and transmit the extracted DC signal to the power density operator 125. Thus, the power density operator 125 and the probe antenna 110 may be electrically isolated therefrom.

In addition, as the probing system 100 extracts the DC signal from the output of the probe antenna 110 and transmits the extracted DC signal to the power density operator 125, the probing system 100 may minimize an influence of the power density operator 125 on the near-field electromagnetic field without using an optical cable and an optical conversion device. That is, the probing system 100 may not require an element or a component related to optical transmission, for example, an optical cable and an optical conversion device, and thus be smaller in size compared to an existing probing system that requires such device related to the optical transmission for a probe antenna.

Figure 6:
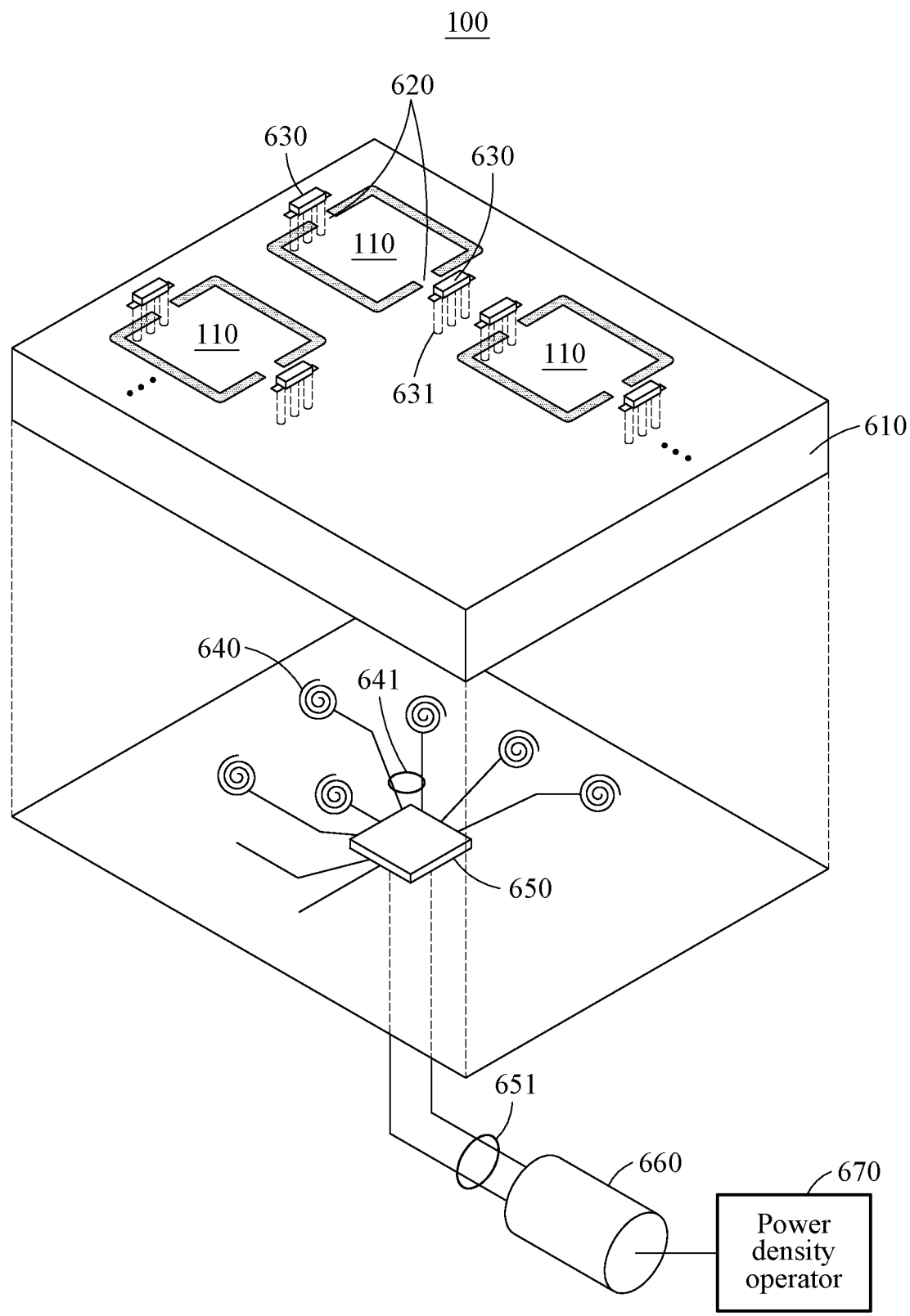
FIG. 6 is a diagram illustrating an example of an antenna array-type probing system according to an example embodiment.

The probing system 100 may be smaller in size than the existing probing system, and embodied as an antenna array-type probing system using a plurality of probe antennas 110 as illustrated in FIG. 6. The antenna array-type probing system may measure power densities at various positions on a plane all at once, and thus reduce the amount of time used to measure a power density distribution in a large area.

Figure 2:
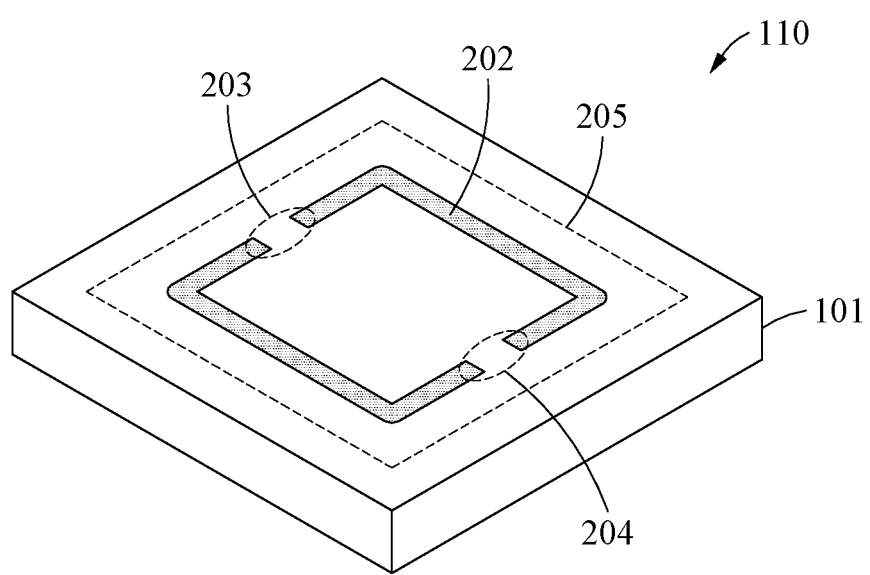
FIG. 2 is a diagram illustrating an example of a structure of a probe antenna according to an example embodiment.

FIG. 2 is a diagram illustrating an example of a structure of a probe antenna according to an example embodiment.

Referring to FIG. 2, the probe antenna 110 includes a circuit board 101, and a conductor transmitting line 202 formed on the circuit board 101, having a constant line width, and formed in a polygonal shape or a closed-curve shape.

The conductor transmitting line 202 may be divided into two portions as illustrated in FIG. 2. A first receiving port 203 and a second receiving port 204 may be formed in the two portions. The probe antenna 110 may receive a signal generated by a near-field electromagnetic field through the first receiving port 203 and the second receiving port 204.

A two-dimensional (2D) area from which a power density is measurable in the probe antenna 110 may be defined by a probe area 205. The probe area 205 may be an area having the same concept as an effective area of a general antenna. That is, the probe antenna 110 may measure a power density of a near-field electromagnetic field present in the probe area 205 on the surface of the circuit board 101.

The probe area 205 of the probe antenna 110 may be determined through measurement or simulation. Based on a size of the probe area 205, a spatial resolution of the probing system 100 including the probe antenna 110 may be determined.

The size of the probe area 205 may be proportional to a size of a polygon or a closed curve formed by the conductor transmitting line 202, and the spatial resolution of the probing system 100 may be determined based on the size of the probe area 205. Thus, the spatial resolution of the probing system 100 may be determined based on the size of the polygon or the closed curve formed by the conductor transmitting line 202. For example, when the size of the polygon or the closed curve formed by the conductor transmitting line 202 decreases, the performance of the spatial resolution of the probing system 100 may increase.

In addition, a resonant frequency of the probe antenna 110 may be determined based on the size of the polygon or the closed curve formed by the conductor transmitting line 202. For example, when an entire length of the conductor transmitting line 202 is the same as a wavelength of an electromagnetic field, the probe antenna 110 may resonate at a corresponding frequency. When the probe antenna 110 resonates, an output of the first receiving port 203 and the second receiving port 204 of the probe antenna 110 may be different from an output at another frequency.

Thus, to prevent such a difference in an output of the first receiving port 203 and the second receiving port 204 based on a frequency, the conductor transmitting line 202 may be designed to have the entire length less than a wavelength of an electromagnetic field to be measured. For example, when a wavelength of an electromagnetic field from which a power density is to be measured is defined as $\lambda$, a length of a side of a tetragon formed by the conductor transmitting line 202 may be $\lambda/8$, and a line width of the conductor transmitting line 202 may be less than or equal to $\lambda/10$.

In addition, an input impedance of the first receiving port 203 and the second receiving port 204 may be determined based on a length of the first transmitting line and the second transmitting line. Here, an impedance corresponding to a portion into which the conductor transmitting line 202 is divided may be obtained using a function of a length into which the conductor transmitting line 202 is divided. The obtained impedance may be the input impedance of the first receiving port 203 and the second receiving port 204.

In addition, when a signal output from the first receiving port 203 and the second receiving port 204 is input to the power density measurer 120, a signal reflection may occur. An amount of the signal reflection may be determined based on an impedance of the first receiving port 203 and the second receiving port 204. That is, when the input impedance of the first receiving port 203 and the second receiving port 204 is different from an input impedance of the power density measurer 120, the signal output from the first receiving port 203 and the second receiving port 204 may be reflected without being input to the power density measurer 120. Thus, to prevent the signal outputs of the first receiving port 203 and the second receiving port 204 from being reflected, the length of the first transmitting line and the second transmitting line may be determined such that the input impedance of the first receiving port 203 and the second receiving port 204 is the same as the input impedance of the power density measurer 120.

Figure 3:
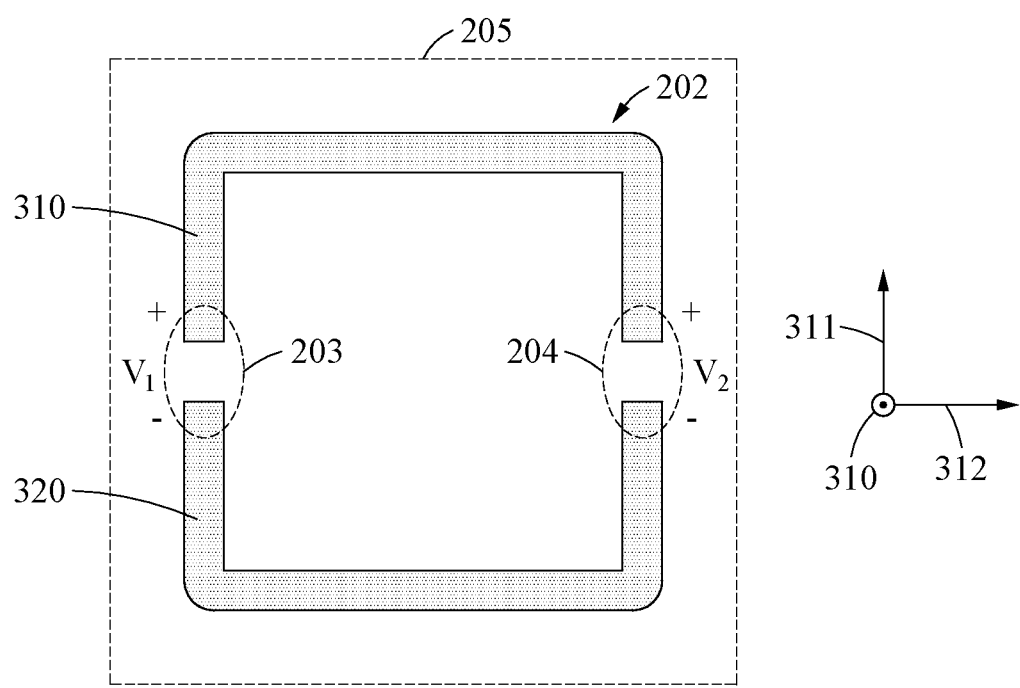
FIG. 3 is a diagram illustrating an example of an operation principle of a probe antenna according to an example embodiment.

FIG. 3 is a diagram illustrating an example of an operation principle of a probe antenna according to an example embodiment. Referring to FIG. 3, the conductor transmitting line 202 is divided into two portions—a first transmitting line 310 and a second transmitting line 320 that are separated from each other. The conductor transmitting line 202 includes a first receiving port 203 formed with one end of the first transmitting line 310 and one end of the second transmitting line 320, and a second receiving port 204 formed with another end of the first transmitting line 310 and another end of the second transmitting line 320.

When it is assumed an electric field and a magnetic field are uniform in a probe area 205, the electric field and the magnetic field may have a same direction and strength in the probe area 205. For example, when a size of a tetragon formed by the conductor transmitting line 202 is less than a threshold value compared to a wavelength of an electromagnetic field, the electric field and the magnetic field may be uniform in the probe area 205.

A signal output from the first receiving port 203 may be defined as $V_1$, and a signal output from the second receiving port 204 may be defined as $V_2$.

Here, the conductor transmitting line 202 may operate as a loop antenna by a magnetic field input to the probe antenna 110.

For example, the magnetic field present in the probe area 205 and formed on a surface of the probe antenna 110 may induce a current to the conductor transmitting line 202 according to the Faraday's law. The induced current may generate a potential difference at the first receiving port 203 and the second receiving port 204.

The current induced according to the Faraday's law may be proportional to a vertical-direction strength of the magnetic field input to the probe antenna 110. Here, a vertical direction of the magnetic field input to the probe antenna 110 may be the same direction as a vertical-direction axis 310 of an antenna surface including the conductor transmitting line 202.

Thus, a potential difference of a signal output from the first receiving port 203 and the second receiving port 204 may be proportional to a strength of a magnetic field in the vertical-direction axis 310 of the antenna surface.

In addition, the current induced by the magnetic field according to the Faraday's law and flowing in the conductor transmitting line 202 may flow clockwise or counterclockwise in the tetragon formed by the conductor transmitting line 202. That is, when the magnetic field is uniform in the probe area 205, signals having potential differences in opposite directions may be output from the first receiving port 203 and the second receiving port 204, respectively.

Thus, the potential differences of the signals output from the first receiving port 203 and the second receiving port 204 by the magnetic field may have different directions. For example, when $V_1$ output from the first receiving port 203 by the magnetic field has a potential difference of a positive value, $V_2$ output from the second receiving port 204 by the magnetic field may have a potential difference of a negative value.

To sum up, the signal output from the first receiving port 203 by the magnetic field and the signal output from the second receiving port 204 by the magnetic field may have the potential differences that are the same in magnitude and different in sign.

In addition, areas of the conductor transmitting line 202 corresponding to the same direction as a vertical-direction axis 311 of the conductor transmitting line 202 may operate as dipole antennas.

That is, an area of the conductor transmitting line 202 including the first receiving port 203 in the same direction as the vertical-direction axis 311 and an area of the conductor transmitting line 202 including the second receiving port 204 in the same direction as the vertical-direction axis 311 may operate as different dipole antennas by an electric field input to the probe antenna 110.

The electric field formed on the surface of the probe antenna 110 may output a potential difference at the first receiving port 203 and the second receiving port 204. The potential different output from the first receiving port 203 and the second receiving port 204 may be proportional to a strength of the electric field in the vertical-direction axis 311 of the conductor transmitting line 202.

When the electric field is uniform in the probe area 205, the electric field having the same direction and strength may be input to the dipole antennas in a direction corresponding to the vertical-direction axis 311 of the conductor transmitting line 202 including the first receiving port 203 and the second receiving port 204. Thus, a potential difference output from the first receiving port 203 and a potential difference output from the second receiving port 204 may have the same sign.

For example, when $V_1$ output from the first receiving port 203 by the electric field has a potential difference of a positive value, $V_2$ output from the second receiving port 204 by the electric field may also have a potential difference of a positive value.

To sum up, a signal output from the first receiving port 203 by the electric field and a signal output from the second receiving port 204 by the electric field may have potential differences that are the same in magnitude and sign.

In addition, when the probe antenna 110 operates as a linear antenna in response to an input electric field, the electric field input into a horizontal-direction axis 312 of the conductor transmitting line 202 may generate a potential difference between the first receiving port 203 and the second receiving port 204. However, the probing system 100 may not use the potential difference generated between the first receiving port 203 and the second receiving port 204 to measure a power density.

Figure 4:
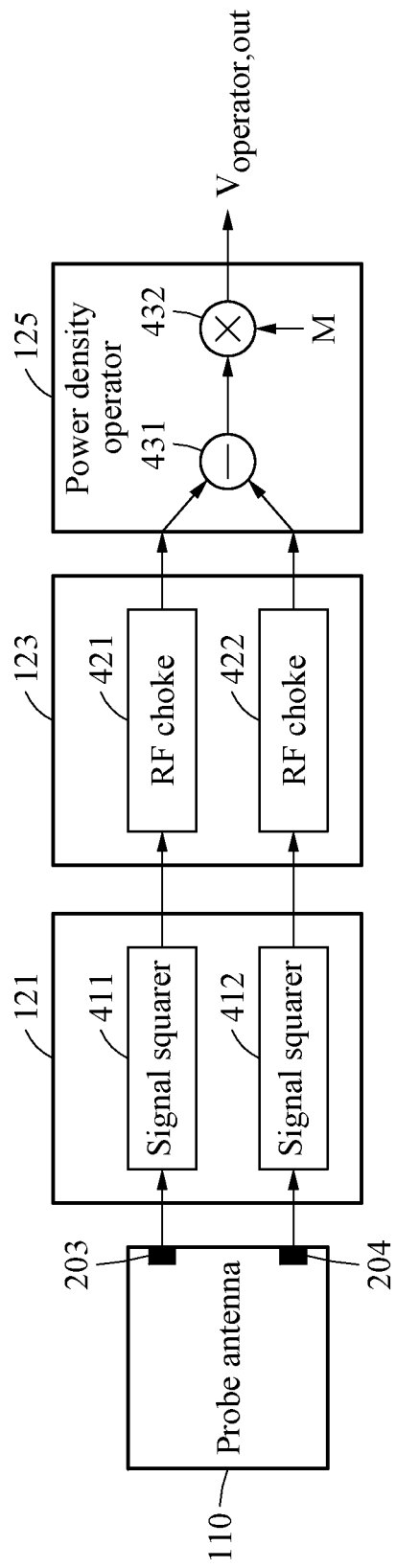
FIG. 4 is a diagram illustrating an example of a power density measurer according to an example embodiment.

FIG. 4 is a diagram illustrating an example of a power density measurer according to an example embodiment.

Referring to FIG. 4, a signal output from the first receiving port 203 of the probe antenna 110 may be input to a first signal squarer 411 of the amplifier 121. In addition, a signal output from the second receiving port 204 of the probe antenna 110 may be input to a second signal squarer 412 of the amplifier 121.

The first signal squarer 411 and the second signal squarer 412 may square the signals received respectively and output the squared signals. For example, each of the first signal squarer 411 and the second signal squarer 412 may be embodied using an RF mixer. The RF mixer may receive an RF signal and a local signal, and then modulate the RF signal. Such modulation performed by the RF mixer may be the same as squaring a sum of the RF signal and the local signal. Thus, by replacing the RF signal and the local signal to be input to the RF mixer with a same RF signal, it is possible to output amplified squared RF signal.

A potential difference output from the first receiving port 203 by a magnetic field, and a potential difference output from the first receiving port 203 by an electric field may be different RF signals. The first signal squarer 411 may receive the potential difference output from the first receiving port 203 by the magnetic field and the potential difference output from the first receiving port 203 by the electric field. Subsequently, the first signal squarer 411 may generate a first output signal by squaring a sum of the potential difference output from the first receiving port 203 by the magnetic field and the potential difference output from the first receiving port 203 by the electric field. In addition, the second signal squarer to 412 may receive a potential difference output from the second receiving port 204 by the magnetic field and a potential difference output from the second receiving port 204 by the electric field. Subsequently, the second signal squarer 412 may generate a second output signal by squaring a sum of the potential difference output from the second receiving port 204 by the magnetic field and the potential difference output from the second receiving port 204 by the electric field.

The first output signal output from the first signal squarer 411 may be input to a first RF choke 421, and the second output signal output from the second signal squarer 412 may be input to a second RF choke 422. Here, an RF choke may extract a DC signal by removing a remaining RF signal, excluding the DC signal, from an input signal. For example, each of the first RF choke 421 and the second RF choke 422 may be embodied using an inductor.

The DC signals extracted by the RF remover 123 may be input to the power density operator 125 as illustrated in FIG. 4.

The power density operator 125 includes a signal subtractor 431 and a signal multiplier 432. The signal subtractor 431 may obtain a difference between the two input signals. The signal multiplier 432 may multiply the obtained difference by a multiplication coefficient to output a result of the multiplying. Since a signal to be input to the power density operator 125 may not be an RF signal but a DC signal, each of the signal subtractor 431 and the signal multiplier 432 may be embodied using an operational amplifier used for an analog circuit.

Figure 5:
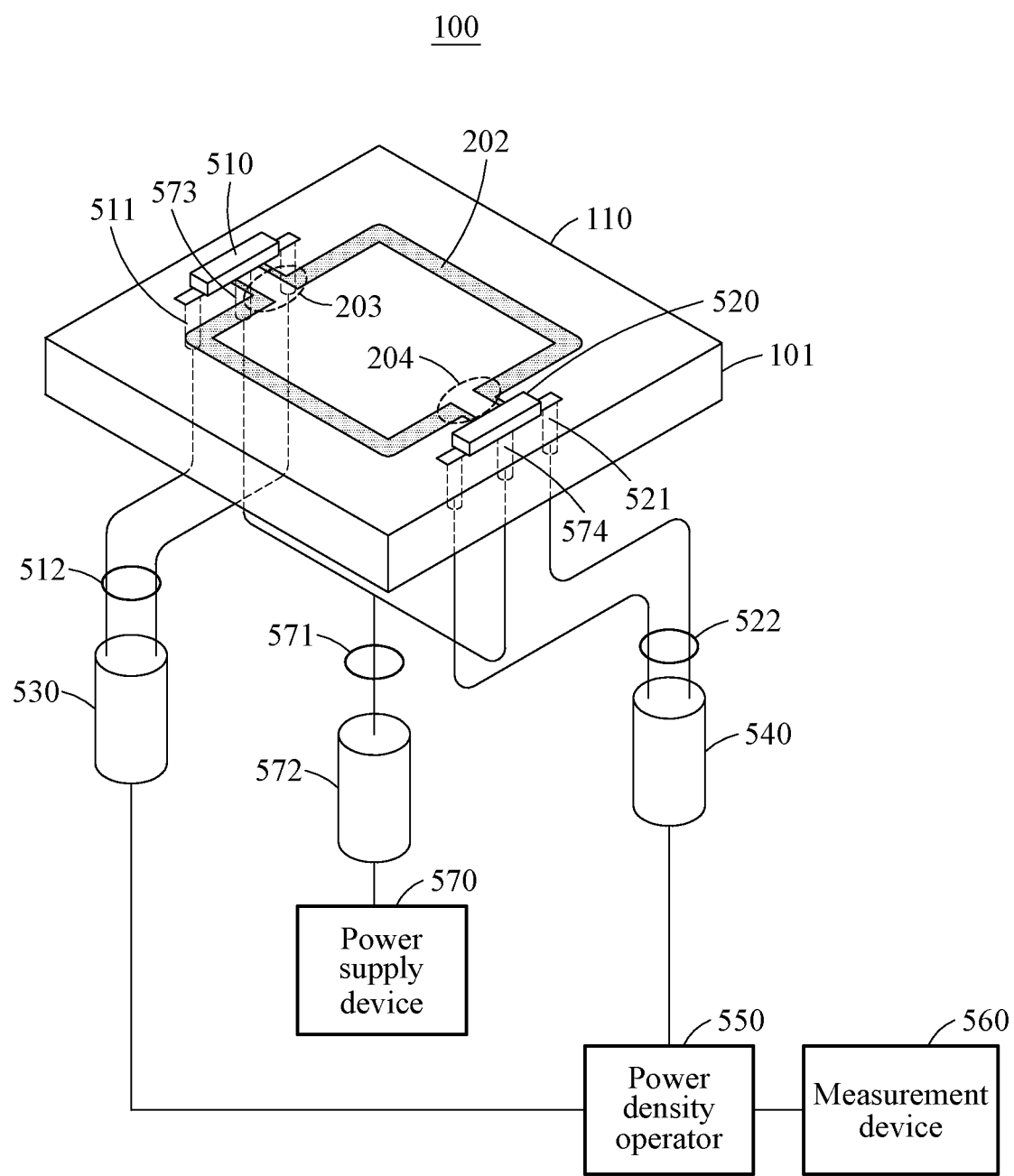
FIG. 5 is a diagram illustrating an example of a signal antenna-type probing system according to an example embodiment.

FIG. 5 is a diagram illustrating an example of a signal antenna-type probing system according to an example embodiment.

Referring to FIG. 5, the probing system 100 may be embodied as a single antenna-type probing system including the probe antenna 110 including the conductor transmitting line 202 formed on the circuit board 101, and a first signal squarer 510 and a second signal squarer 520.

The first signal squarer 510 may be disposed adjacent to the first receiving port 203, and the second signal squarer 520 may be disposed adjacent to the second receiving port 204. In addition, the first signal squarer 510 and the second signal squarer 520 may be produced using an RF mixer produced in a small size using a semiconductor transistor, and installed adjacent to the first receiving port 203 and the second receiving port 204, respectively.

A first output signal output from the first signal squarer 510 may be transmitted to a signal squarer conductor transmitting line 512 connected to a lower surface of the circuit board 101 through a via 511. A first RF choke 530 may extract a DC signal from a first output signal passing through the signal squarer conductor transmitting line 512, and transmit the extracted DC signal to a power density operator 550.

In addition, a second output signal output from the second signal squarer 520 may be transmitted to a signal squarer conductor transmitting line 522 connected to the lower surface of the circuit board 101 through a via 521. A second RF choke 540 may extract a DC signal from a second output signal passing through the signal squarer conductor transmitting line 522, and transmit the extracted DC signal to the power density operator 550.

The power density operator 550 may multiply, by a multiplication coefficient, a difference between the DC signal extracted from the first output signal and the DC signal extracted from the second output signal, and output a result of the multiplying.

A measurement device 560 may measure a power density of a near-field electromagnetic field using a signal output from the power density operator 550. The measurement device 560 may be an oscilloscope or a spectrum analyzer, for example.

The power density operator 550 and the measurement device 560 may be disposed at a position separate from the circuit board 101 to minimize an influence on the measurement of the near-field electromagnetic field. In addition, the power density operator 550 and the measurement device 560 may be installed in a shielding box to reduce further the influence on the measurement.

Although the measurement device 560 is illustrated in FIG. 5 as being a separate component or element from the power density operator 550, the measurement device 560 may be included in the power density operator 550 along with the signal subtractor 431 and the signal multiplier 432.

The first RF choke 530 and the second RF choke 540 may remove RF signals respectively from the first output signal and the second output signal, and electrically isolate the power density operator 550 from the first signal squarer 510 and the second signal squarer 520. Thus, the first RF choke 530 and the second RF choke 540 may prevent the power density operator 550 from having an influence on the measurement of the power density.

That is, according to examples, by increasing the number of RF chokes to be installed between the power density operator 550, and the first signal squarer 510 and the second signal squarer 520, it is possible to increase a level of an electrical isolation between the power density operator 550, and the first signal squarer 510 and the second signal operator 520.

In addition, for the first signal squarer 510 and the second signal squarer 520 to operate, a power supply may be needed.

However, a power supply device 570 configured to supply power to the first signal squarer 510 and the second signal squarer 520 may have an influence on the measurement of the power density, and thus the power supply device 570 may be installed at a position separate from the circuit board 101.

The power supply device 570 may supply power to the first signal squarer 510 and the second signal squarer 520 through a power supply conductor transmitting line 571. In addition, by installing a third RF choke 572 in the power supply conductor transmitting line 571, it is possible to electrically isolate the power supply device 570 from the first signal squarer 510 and the second signal squarer 520.

Here, power to be transmitted from the power supply conductor transmitting line 571 may be transmitted from the lower surface of the circuit board 101 to an upper surface of the circuit board 101 through vias 573 and 574, and supplied to the first signal squarer 510 and the second signal squarer 520.

FIG. 6 is a diagram illustrating an example of an antenna array-type probing system according to an example embodiment.

Referring to FIG. 6, the probing system 100 may be embodied as an antenna array-type probing system by arranging a plurality of probe antennas 110 on the single circuit board 610 as illustrated in FIG. 6. A diagram shown below the circuit board 610 is a projection of a lower surface of the circuit board 610.

A probe antenna 110 may measure a power density of an electromagnetic field inside a probe area, and may not measure a power density of an electromagnetic field outside the probe area. Thus, to measure power densities at a plurality of positions on a 2D plane, a power density may need to be measured at each of the positions by moving the probe antenna 110 to the positions. That is, when a size of the 2D plane from which a power density distribution is to be measured is large, a great amount of time may be used for the probe antenna 110 to move, and thus a measurement time may increase.

However, the antenna array-type probing system may measure the power densities at the positions on the 2D plane all at once using the plurality of probe antennas 110, and thus may reduce an amount of time to be used to measure the power density distribution on the 2D plane.

In the antenna array-type probing system, signal squarers 630 may be installed at positions adjacent to receiving ports 620 included in each of the probe antennas 110.

On the lower surface of the circuit board 610, flat inductors 640 may be installed. The flat inductors 640 may pass a DC signal and attenuate an RF signal, and may thus function as RF chokes described above with reference to FIG. 5.

In addition, on the circuit board 610, vias 631 connecting outputs of the signal squarers 630 to the flat inductors 640 may be installed. The flat inductors 640 may be connected to a DC switch 650 through RF choke conductor transmitting lines 641. As described above, the flat inductors 640 may remove RF signals from input signals and output only DC signals, and thus signals to be transmitted to the DC switch 650 through the RF choke conductor transmitting lines 641 may be DC signals extracted from respective output signals of the signal squarers 630.

The DC switch 650 may select one of the DC signals received through the RF choke conductor transmitting lines 641, and transmit the selected DC signal to a power density operator 670 through a switch conductor transmitting line 651. An RF choke 660 may be installed in the switch conductor transmitting line 651, and thus electrically isolate the power density operator 670 from the DC switch 650.

The DC switch 650 may be configured to select one from DC signals and transmit the selected DC signal, and thus have a low signal loss and be fast in switching speed, compared to an RF switch configured to select one from RF signals and transmit the selected RF signal.

That is, the antenna array-type probing system may sequentially input DC signals received from the flat inductors 640 to the power density operator 670 using the DC switch 650, and sequentially transmit outputs of the power density operator 670 to a measurement device, thereby measuring a power density distribution on a 2D plane all at once.

Figure 7:
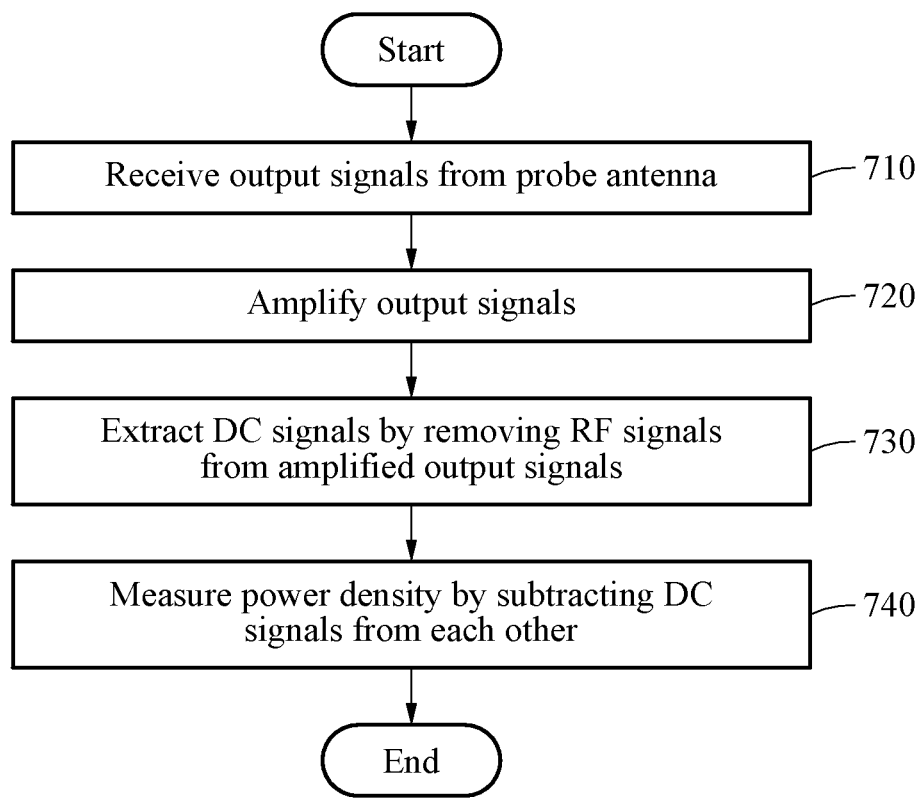
FIG. 7 is a flowchart illustrating an example of a power density measuring method according to an example embodiment.

FIG. 7 is a flowchart illustrating an example of a power density measuring method according to an example embodiment.

Referring to FIG. 7, in operation 710, the amplifier 121 receives, from the first receiving port 203 and the second receiving port 204, a signal of a potential difference by a magnetic field and a signal of a potential difference by an electric field.

Here, when the signal of the potential difference by the magnetic field is defined as $V_H$ and the signal of the potential difference by the electric field is defined as $V_E$, $V_H$ and $V_E$ may be represented by Equation 1 below.

$$V_H = v_H \cdot \sin(\omega t + \theta_H)$$

$$V_E = v_E \cdot \sin(\omega t + \theta_E) \quad \text{Equation 1}$$

In Equation 1, ω denotes an angular frequency of an electromagnetic field input to the probe antenna 110.

As described above, the probe antenna 110 may operate as a loop antenna in response to a magnetic field input to the probe antenna 110, and as a linear antenna in response to an electric field input to the probe antenna 110. Thus, the potential differences respectively output from the first receiving port 203 and the second receiving port 204 may be proportional to a strength of the magnetic field and a strength of the electric field. In addition, the magnetic field and the electric field may have different phases in a near-field region, and thus the signals $V_H$ and $V_E$ of the potential differences output from the first receiving port 203 and the second receiving port 204 may have different phases.

In Equation 1, $\theta_H$ denotes a phase of the magnetic field and $\theta_E$ denotes a phase of the electric field. In addition, $v_H$ denotes an amplitude of the signal $V_H$ of the potential difference by the magnetic field, and $v_E$ denotes an amplitude of the signal $V_E$ of the potential difference by the electric field. The potential differences are proportional to a strength of the magnetic field and a strength of the electric field, and thus $v_H$ may be proportional to a strength of the magnetic field in the vertical-direction axis 310 of the antenna surface and $v_E$ may be proportional to a strength of the electric field in the vertical-direction axis 311 of the conductor transmitting line 202. Here, a proportion coefficient may be determined by a length and a line width of the conductor transmitting line 202, and a dielectric constant of the circuit board 101.

In addition, the magnetic field and the electric field may exist concurrently in the near-field region, and thus $V_H$ and $V_E$ may be concurrently output from each of the first receiving port 203 and the second receiving port 204.

Thus, a first output signal $V_1$ output from the first receiving port 203 and a second output signal $V_2$ output from the second receiving port 204 may include both the signal $V_H$ of the potential difference by the magnetic field and the signal $V_E$ of the potential difference by the electric field, as represented by Equation 2 below.

$$V_1 = V_H + V_E = v_H \cdot \sin(\omega t + \theta_H) + v_E \cdot \sin(\omega t + \theta_E)$$

$$V_2 = -V_H + V_E = v_H \cdot \sin(\omega t + \theta_H) + v_E \cdot \sin(\omega t + \theta_E) \quad \text{Equation 2}$$

Here, signs of the potential differences respectively output from the first receiving port 203 and the second receiving port 204 by the magnetic field may be different from each other. Thus, a positive sign may be attached to $V_H$ of the first output signal $V_1$, and a negative sign may be attached to $V_H$ of the second output signal $V_2$.

The amplifier 121 may receive the first output signal $V_1$ and the second output signal $V_2$ respectively from the first receiving port 203 and the second receiving port 204 of the probe antenna 110.

In operation 720, the amplifier 121 amplifies the signals received in operation 710. The first signal squarer 411 of the amplifier 121 may amplify the first output signal $V_1$ received from the first receiving port 203, and output an amplified signal $V_{1,double}$ which may be represented by Equation 3 below.

$$V_{1,double} = \alpha(V_1)^2 = \alpha[v_H \cdot \sin(\omega t + \theta_H) + v_E \cdot \sin(\omega t + \theta_E)]^2 \quad \text{Equation 3}$$

$$= \frac{\alpha}{2}[v_H^2 \sin^2(\omega t + \theta_H) + v_E^2 \sin^2(\omega t + \theta_E) 2 v_H v_E \sin(\omega t + \theta_H)\sin(\omega t + \theta_E)]$$

$$= \frac{\alpha}{2}\left[\frac{v_H^2}{2} - \frac{v_H^2}{2}\cos(2\omega t + 2\theta_H) + \frac{v_E^2}{2} - \frac{v_E^2}{2}\cos(2\omega t + 2\theta_E) + v_H v_E \cos(\theta_H - \theta_E) - v_H v_E \cos(2\omega t + \theta_H + \theta_E)\right]$$

In Equation 3, α denotes an amplification gain which is an increase in the amplitude that may occur in the first signal squarer 411 and the second signal squarer 412. In addition, the second signal squarer 412 may amplify the second output signal $V_2$ received from the second receiving port 204, and output an amplified signal $V_{2,double}$ which may be represented by Equation 4 below.

$$V_{2,double} = \alpha(V_2)^2 = \alpha[-v_H \cdot \sin(\omega t + \theta_H) + v_E \cdot \sin(\omega t + \theta_E)]^2 \quad \text{Equation 4}$$

$$= \frac{\alpha}{2}[v_H^2 \sin^2(\omega t + \theta_H) + v_E^2 \sin^2(\omega t + \theta_E) - 2 v_H v_E \sin(\omega t + \theta_H)\sin(\omega t + \theta_E)]$$

$$= \frac{\alpha}{2}\left[\frac{v_H^2}{2} - \frac{v_H^2}{2}\cos(2\omega t + 2\theta_H) + \frac{v_E^2}{2} - \frac{v_E^2}{2}\cos(2\omega t + 2\theta_E) - v_H v_E \cos(\theta_H - \theta_E) + v_H v_E \cos(2\omega t + \theta_H + \theta_E)\right]$$

In operation 730, the RF remover 123 extracts DC signals by removing RF signals from the first output signal and the second output signal that are amplified by the amplifier 121.

The first RF choke 421 of the RF remover 123 may remove signal components having 2ωt from the signal $V_{1,double}$ output from the first signal squarer 411. The signal components having 2ωt may correspond to an RF signal, and signal components not having 2ωt may correspond to a DC signal. Thus, a signal $V_{1,double,choke}$ output from the first RF choke 421 may be a DC signal extracted from the first output signal, and be represented by Equation 5 below.

$$V_{1,double,choke} = \frac{\alpha}{2}\left[\frac{v_H^2}{2} + \frac{v_E^2}{2} + v_H v_E \cos(\theta_H - \theta_E)\right] \quad \text{Equation 5}$$

In addition, the second RF choke 422 of the RF remover 123 may remove signal components having 2ωt from the signal $V_{2,double}$ output from the second signal squarer 412. Thus, a signal $V_{2,double,choke}$ output from the second RF choke 422 may be a DC signal extracted from the second output signal, and be represented by Equation 6 below.

$$V_{2,double,choke} = \frac{\alpha}{2}\left[\frac{v_H^2}{2} + \frac{v_E^2}{2} + v_H v_E \cos(\theta_H - \theta_E)\right] \quad \text{Equation 6}$$

In operation 740, the power density operator 125 may measure a power density of a near-field electromagnetic field by subtracting the DC signal extracted from the first output signal and the DC signal extracted from the second output signal from each other.

For example, the signal subtractor 431 of the power density operator 125 may output a difference between the signal $V_{1,double,choke}$ output from the first RF choke 421 and the signal $V_{2,double,choke}$ output from the second RF choke 422. The signal multiplier 432 of the power density operator 125 may then multiply the difference output from the signal subtractor 431 by a multiplication coefficient and output a result of the multiplying.

When the multiplication coefficient is defined as M, an output $V_{operator,out}$ of the power density operator 125 may be represented by Equation 7 below.

$$V_{operator,out} = \alpha M v_H v_E \cos(\theta_H - \theta_E) \quad \text{Equation 7}$$

In Equation 7, $\theta_H$ denotes a phase of the magnetic field, and $\theta_E$ denotes a phase of the electric field. In addition, the output $V_{operator,out}$ of the power density operator 125 may be proportional to the amplitude $v_H$ of the signal $V_H$ of the potential difference by the magnetic field and the amplitude $v_E$ of the signal $V_E$ of the potential difference by the electric field. The amplitude $v_H$ may be proportional to a strength of the magnetic field in the vertical-direction axis 310 of the antenna surface. The amplitude $v_E$ may be proportional to a strength of the electric field in the vertical-direction axis 311 of the conductor transmitting line 202. The vertical-direction axis 310 of the antenna surface and the vertical-direction axis 311 of the conductor transmitting line 202 may be orthogonal to each other.

A power density PD of the electromagnetic field may be represented by Equation 8 below.

$$PD = \frac{1}{2}E_\perp H_\perp \cos(\theta_H - \theta_E) \quad \text{Equation 8}$$

In Equation 8, $E_\perp$ denotes a strength of the electric field, and $H_\perp$ denotes a strength of the magnetic field. The amplitude $v_H$ may be proportional to the strength $H_\perp$ of the magnetic field and the amplitude $v_E$ may be proportional to the strength $H_\perp$ of the electric field.

In addition, the term $(\theta_H - \theta_E)$ in Equation 7 that is associated with a phase difference between the magnetic field and the electric field may also be included in Equation 8. The amplification gain a of the amplifier 121 and the multiplication coefficient M of the signal multiplier 432 may be constants determined in a process of designing the probing system 100. Thus, a product of multiplication of $v_H$, $v_E$, and the phase difference-related term may be proportional to the power density of the electromagnetic field input to the probe antenna 110.

Thus, Equation 9 may be obtained by referring to Equations 7 and 8.

$$V_{operator,out} = \alpha M v_H v_E \cos(\theta_H - \theta_E) = F_{PD} \cdot \frac{1}{2}E_\perp H_\perp \cos(\theta_H - \theta_E) \quad \text{Equation 9}$$

In Equation 9, $F_{PD}$ denotes a proportion coefficient that the output of the power density operator 125 has for a power density. That is, the output of the power density operator 125 may be proportional to a power density of the electromagnetic field input to the probe antenna 110. Thus, by identifying the proportion coefficient $F_{PD}$ and applying the output of the power density operator 125 to Equation 9, it is possible to measure the power density of the electromagnetic field input to the probe antenna 110.

Here, the probing system 100 may identify the proportion coefficient $F_{PD}$ by correcting the probe antenna 110 using an electromagnetic field of which a power density is already known.

For example, a transverse electromagnetic (TEM) cell or a gigahertz TEM (GTEM) cell that are used to measure an electromagnetic field may be used to generate a uniform electromagnetic field. The TEM cell or the GTEM cell may be used to identify in advance a direction and a strength of each of an electric field and a magnetic field generated inside the cell. The electric field and the magnetic field generated inside the TEM cell or the GTEM cell may be orthogonal to each other. In addition, there may be no phase difference between the electric field and the magnetic field generated inside the TEM cell or the GTEM cell.

Thus, when generating the uniform electromagnetic field using the TEM cell or the GTEM cell, a strength of each of the electric field and the magnetic field generated in the TEM cell or the GTEM cell may be known in advance. Thus, the probing system 100 may input, to Equation 8, the strength of each of the electric field and the magnetic field generated in the TEM cell or the GTEM cell, and then calculate a power density $PD_{cal}$ of the electromagnetic field generated using the TEM cell or the GTEM cell.

Since there is no phase difference between the electric field and the magnetic field generated in the TEM cell or the GTEM cell, $\theta_H$ and $\theta_E$ may be the same value. Thus, the power density $PD_{cal}$ may be represented by Equation 10 below.

$$PD_{cal} = \frac{1}{2}E_{\perp,cal} H_{\perp,cal} \quad \text{Equation 10}$$

In Equation 10, $E_{\perp,cal}$ denotes a strength of the electric field of the electromagnetic field generated using the TEM cell or the GTEM cell. $H_{\perp,cal}$ denotes a strength of the magnetic field of the electromagnetic field generated using the TEM cell or the GTEM cell.

In addition, when the probe antenna 110 is disposed in the electromagnetic field generated using the TEM cell or the GTEM cell, the output $V_{operator,out}$ of the power density operator 125 may be represented by Equation 11 based on Equations 9 and 10.

$$V_{operator,out,cal} = F_{PD} \cdot PD_{cal} \quad \text{Equation 11}$$

Here, a measurement device of the probing system 100 may obtain the proportion coefficient $F_{PD}$ by applying, to Equation 11, the power density $PD_{cal}$ calculated using Equation 9 and the output $V_{operator,out}$ of the power density operator 125. In addition, the measurement device may measure the power density PD by inputting the output $V_{operator,out}$ of the power density operator 125 to Equation 12 modified from Equation 9.

$$PD = \frac{1}{2} E_\perp H_\perp \cos(\theta_H - \theta_E) = \frac{V_{operator,out}}{F_{PD}} \quad \text{Equation 12}$$

The probing system 100 may measure a power density of a near-field electromagnetic field in which a magnetic field and an electric field have a phase difference by calculating the power density based on the phase difference between the magnetic field and the electric field.

A probing system or a power density measuring method described herein may be drafted as a program that may be executed in a computer, and embodied by various types of a recording medium, such as, for example, a magnetic storage medium, optical read medium, or a digital storage medium.

According to example embodiments described herein, by measuring an electric field and a magnetic field using a single probe antenna, it is possible to also measure a phase difference between the electric field and the magnetic field, and thus measure a power density of a near-field electromagnetic field without an error.

According to example embodiments described herein, by arranging a power density operator configured to measure a power density of a near-field electromagnetic field to be separate from a probe antenna such that they are electrically isolated from each other, it is possible to minimize an influence of the power density operator on the near-field electromagnetic field.

According to example embodiments described herein, by extracting a DC signal from an output signal of a probe antenna and transmitting the DC signal to a power density operator without using an optical cable and an optical conversion device, and by minimizing an influence of the power density operator on a near-field electromagnetic field, it is possible to provide a smaller probing system in size compared to an existing probing system.

According to example embodiments described herein, by embodying an antenna array-type probing system using a plurality of probe antennas, it is possible to measure power densities at various positions on a plane all at once.

The units described herein may be implemented using hardware components and software components. For example, the hardware components may include microphones, amplifiers, band-pass filters, audio to digital convertors, non-transitory computer memory and processing devices. A processing device may be implemented using one or more general-purpose or special purpose computers, such as, for example, a processor, a controller and an arithmetic logic unit (ALU), a digital signal processor, a microcomputer, a field programmable gate array (FPGA), a programmable logic unit (PLU), a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, to independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums. The non-transitory computer readable recording medium may include any data storage device that can store data which can be thereafter read by a computer system or processing device.

The methods according to the above-described example embodiments may be recorded in non-transitory computer-readable media including program instructions to implement various operations of the above-described example embodiments. The media may also include, alone or in combination with the program instructions, data files, data structures, and the like. The program instructions recorded on the media may be those specially designed and constructed for the purposes of example embodiments, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher level code that may be executed by the computer using an interpreter. The above-described devices may be configured to act as one or more software modules in order to perform the operations of the above-described example embodiments, or vice versa.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A probe antenna comprising:
a board; and
a conductor transmitting line formed on the board, having a constant line width, and formed in a polygonal shape or in a closed-curve shape,
wherein the conductor transmitting line is divided into a first transmitting line and a second transmitting line that are separated from each other, and comprises a first receiving port formed with one end of the first transmitting line and one end of the second transmitting line, and a second receiving port formed with another end of the first transmitting line and another end of the second transmitting line.

2. The probe antenna of claim 1, wherein an input impedance of the first receiving port and the second receiving port is determined based on a length of the first transmitting line and the second transmitting line.

3. The probe antenna of claim 1, wherein, as the conductor transmitting line operates as a loop antenna by a magnetic field input to the probe antenna, the conductor transmitting line is configured to generate a potential difference at the first receiving port and the second receiving port that is proportional to a strength of the magnetic field.

4. The probe antenna of claim 1, wherein the first receiving port is configured to generate a potential difference that has a same magnitude as that of a potential difference output from the second receiving port and a direction opposite to that of the potential difference output from the second receiving port.

5. The probe antenna of claim 1, wherein, as transmitting line areas comprising the first receiving port and the second receiving port operate as different dipole antennas by an electric field input to the probe antenna, the conductor transmitting line is configured to generate a potential difference at the first receiving port and the second receiving port that is proportional to a strength of the electric field.

6. The probe antenna of claim 5, wherein the first receiving port is configured to generate a potential difference that has a same magnitude and a same direction as those of a potential difference output from the second receiving port.

7. The probe antenna of claim 1, wherein the first receiving port is configured to output a first output signal by adding a potential difference that is proportional to a strength of a magnetic field and output from the first receiving port and a potential difference that is proportional to a strength of an electric field and output from the first receiving port, and
the second receiving port is configured to output a second output signal by adding a potential difference obtained by reversing a sign of a potential difference that is proportional to a strength of a magnetic field and output from the second receiving port, and a potential difference that is proportional to a strength of an electric field and output from the second receiving port.

8. The probe antenna of claim 1, wherein the first receiving port is configured to output a first output signal by adding a potential difference obtained by reversing a sign of a potential difference that is proportional to a strength of a magnetic field and output from the first receiving port, and a potential difference that is proportional to a strength of an electric field and output from the first receiving port, and
the second receiving port is configured to output a second output signal by adding a potential difference that is proportional to a strength of a magnetic field and output from the second receiving port and a potential difference that is proportional to a strength of an electric field and output from the second receiving port.

9. A probing system comprising:
a probe antenna comprising a board, and a conductor transmitting line formed on the board, having a constant line width, and formed in a polygonal shape or a closed-curve shape; and
a power density measurer configured to measure a power density of an electromagnetic field in which the probe antenna is disposed using output signals of the probe antenna,
wherein the conductor transmitting line is divided into a first transmitting line and a second transmitting line that are separated from each other, and comprises a first receiving port formed with one end of the first transmitting line and one end of the second transmitting line, and a second receiving port formed with another end of the first transmitting line and another end of the second transmitting line,
wherein the power density measurer comprises a power density operator configured to measure the power density of the electromagnetic field using a first output signal output from the first receiving port and a second output signal output from the second receiving port.

10. The probing system of claim 9, wherein the conductor transmitting line is configured to:
as the conductor transmitting line operates as a loop antenna by a magnetic field input to the probe antenna, generate a potential difference at the first receiving port and the second receiving port that is proportional to a strength of the magnetic field; and
as transmitting line areas comprising the first receiving port and the second receiving port operate as different dipole antennas by an electric field input to the probe antenna, generate a potential difference at the first receiving port and the second receiving port that is proportional to a strength of the electric field.

11. The probing system of claim 9, wherein the output signals of the probe antenna comprise the first output signal and the second output signal,
wherein the first receiving port is configured to output the first output signal by adding a potential difference that is proportional to a strength of a magnetic field and output from the first receiving port and a potential difference that is proportional to a strength of an electric field and output from the first receiving port, and
the second receiving port is configured to output the second output signal by adding a potential difference obtained by reversing a sign of a potential difference that is proportional to a strength of a magnetic field and output from the second receiving port, and a potential difference that is proportional to a strength of an electric field and output from the second receiving port.

12. The probing system of claim 9, wherein the output signals of the probe antenna comprise the first output signal and the second output signal,
   wherein the first receiving port is configured to output the first output signal by adding a potential difference obtained by reversing a sign of a potential difference that is proportional to a strength of a magnetic field and output from the first receiving port, and a potential difference that is proportional to a strength of an electric field and output from the first receiving port, and
   the second receiving port is configured to output the second output signal by adding a potential difference that is proportional to a strength of a magnetic field and output from the second receiving port and a potential difference that is proportional to a strength of an electric field and output from the second receiving port.

13. The probing system of claim 9, wherein the power density measurer further comprises a radio frequency (RF) remover configured to extract direct current (DC) signals by removing an RF signal from each of the first output signal output from the first receiving port and the second output signal output from the second receiving port,
   wherein the power density operator is configured to measure the power density of the electromagnetic field based on a result of subtracting the DC signal extracted from the first output signal and the DC signal extracted from the second output signal from each other.

14. A probing system comprising:
   a plurality of probe antennas each comprising a board, and a conductor transmitting line formed on the board, having a constant line width, and formed in a polygonal shape or a closed-curve shape;
   a plurality of inductors configured to extract direct current (DC) signals from output signals received from the probe antennas;
   a switch configured to sequentially select the DC signals extracted by the inductors; and
   a power density operator configured to measure a power density of an electromagnetic field in which the probe antennas are disposed using the selected DC signals,
   wherein the conductor transmitting line is divided into a first transmitting line and a second transmitting line that are separated from each other, and comprises a first receiving port formed with one end of the first transmitting line and one end of the second transmitting line, and a second receiving port formed with another end of the first transmitting line and another end of the second transmitting line,
   wherein the power density operator is configured to measure the power density of the electromagnetic field using a DC signal extracted from a first output signal output from the first receiving port and a DC signal extracted from a second output signal output from the second receiving port.

* * * * *